United States Patent
Rupoli

(10) Patent No.: US 11,415,404 B2
(45) Date of Patent: Aug. 16, 2022

(54) APPARATUS FOR DETECTING AT LEAST ONE PHYSICAL QUANTITY OF A FERROMAGNETIC PRODUCT, INSTALLATION FOR THE PRODUCTION OF SAID PRODUCT, AND DETECTION METHOD

(71) Applicant: SCHNELL S.P.A., Colli al Metauro (IT)

(72) Inventor: Simone Rupoli, Colli al Metauro (IT)

(73) Assignee: SCHNELL S.P.A., Colli al Metauro (IT)

(*) Notice: Subject to any disclaimer, the term of this patent is extended or adjusted under 35 U.S.C. 154(b) by 131 days.

(21) Appl. No.: 16/768,441

(22) PCT Filed: Dec. 6, 2018

(86) PCT No.: PCT/IT2018/050239
§ 371 (c)(1),
(2) Date: May 29, 2020

(87) PCT Pub. No.: WO2019/111289
PCT Pub. Date: Jun. 13, 2019

(65) Prior Publication Data
US 2020/0386532 A1    Dec. 10, 2020

(30) Foreign Application Priority Data

Dec. 6, 2017   (IT) .......................... 102017000141343

(51) Int. Cl.
*G01N 27/72*    (2006.01)
*G01R 33/02*    (2006.01)
*G01B 7/12*     (2006.01)

(52) U.S. Cl.
CPC .............. *G01B 7/125* (2013.01); *G01N 27/72* (2013.01); *G01R 33/02* (2013.01)

(58) Field of Classification Search
None
See application file for complete search history.

(56) References Cited

U.S. PATENT DOCUMENTS

| | | | | |
|---|---|---|---|---|
| 3,747,085 A | * | 7/1973 | Bala ..................... | B23B 49/001 |
| | | | | 340/680 |
| 4,050,010 A | * | 9/1977 | Isnard .................... | G01B 7/001 |
| | | | | 324/234 |
| 4,394,193 A | | 7/1983 | Gfrerer | |
| 2009/0072822 A1 | * | 3/2009 | Sun ..................... | G01N 27/9046 |
| | | | | 324/238 |

OTHER PUBLICATIONS

Corver et al.; NMR Measuring System; International Publication Date Dec. 2, 2004 (Dec. 12, 2004); The BOC Group, Inc.; WO 2004/104989 A2; G10R (Year: 2004).*

* cited by examiner

*Primary Examiner* — Nasima Monsur
(74) *Attorney, Agent, or Firm* — McGlew and Tuttle, P.C.

(57) ABSTRACT

The apparatus for detecting at least one physical quantity of a ferromagnetic product (5) comprises an iron core (2, 2', 2", 2'") having an annular shape open at a respective discontinuity or air gap, a detection zone (3, 3', 3", 3'") being defined by the aforementioned air gap, and at least one electrical winding (4, 40), wound around at least a portion of said core (2, 2', 2", 2'").

19 Claims, 9 Drawing Sheets

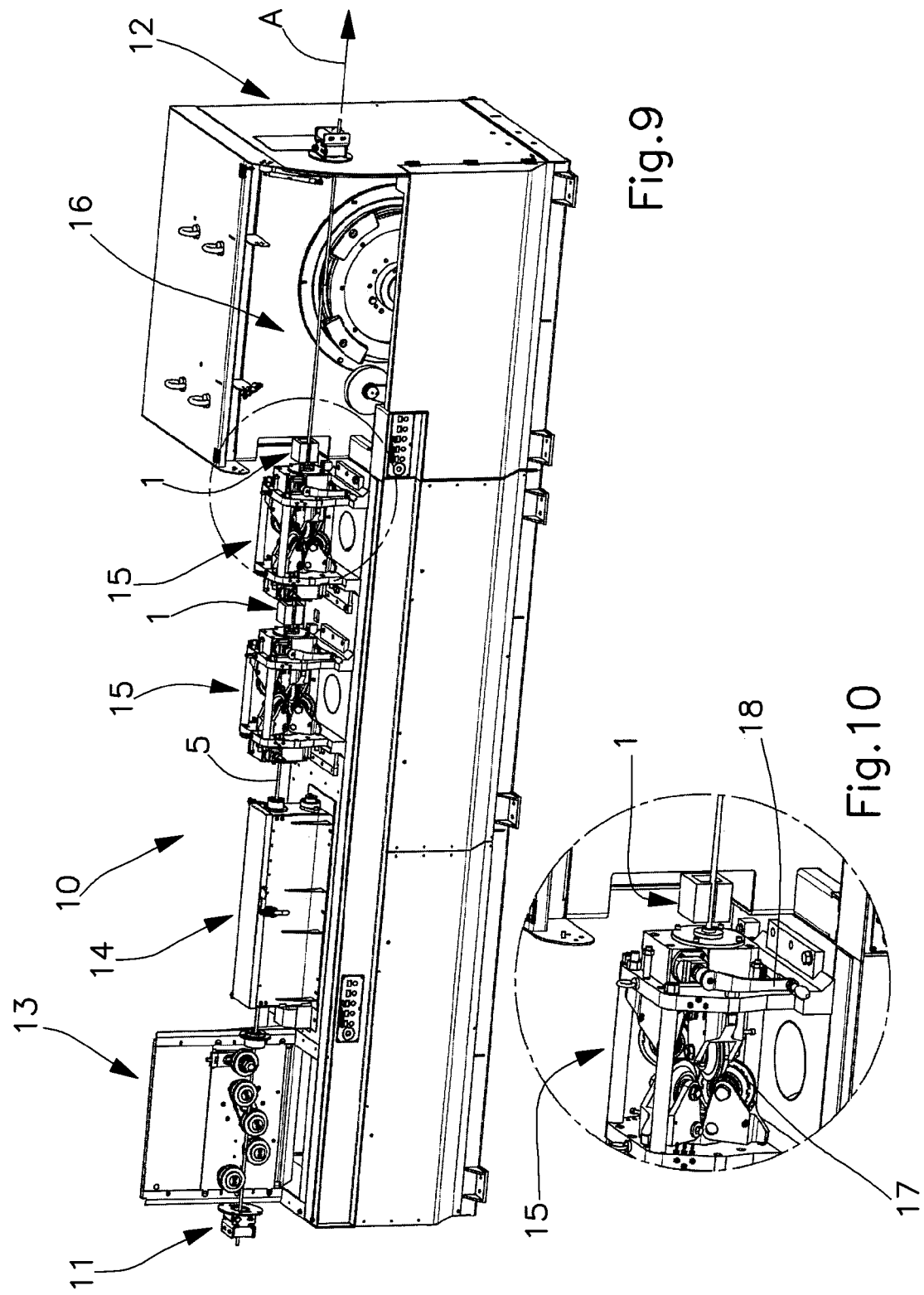

APPARATUS FOR DETECTING AT LEAST ONE PHYSICAL QUANTITY OF A FERROMAGNETIC PRODUCT, INSTALLATION FOR THE PRODUCTION OF SAID PRODUCT, AND DETECTION METHOD

TECHNICAL FIELD

The present invention is directed to an apparatus for detecting at least one physical quantity of a ferromagnetic product, an installation for the production of the said product, in particular for the production of elongated metal profiles, and a detection method.

PRIOR ART

There are known installations for the production of metal wires, for example made of iron and therefore ferromagnetic, through wire drawing, a forming process that, by subjecting the raw material to specific actions of compression and traction in different directions, through suitable frames, in particular rotating ones, determines a variation of the shape of the material, by plastic deformation.

For example, it is possible to make, continuously, through wire drawing of metal materials, threads, bars, as well as profiles and pipes of any gauge. In particular, in the case of bars or wires to be made in rolls, the wire drawing process is also used for improving the mechanical properties of the product, by surface work-hardening, as well as for shaping the size and surface finishing thereof.

In particular, in the field of the production of steel rods with improved adhesion, for the building industry, it is important to monitor the geometric dimensions of the bar or the rod to be produced, for reasons of economy and production efficiency.

The steel rods with improved adhesion, in particular, are characterized by superficial ribs associated with an external ribbing, which defines very complex structure, difficult to detect.

In fact, unlike smooth rods, for which it is possible to measure the outside diameter using direct methods, such as vision, by contact or without, in the case of rods with improved adhesion it is not possible to employ such known means due to the complex external structure that characterizes this type of product. In addition, contrary to the case of smooth rods, where it is also possible to determine a degree of ovality of the section simply noting, at more radial directions, the value of the outer diameter, in the case of rods with improved adhesion, this is not possible, also because of fact that in some types of machines the section of the rod, being helically wound with respect to its axis as result of induced torsion actions, during its advancement motion, does not appear constantly oriented in the same way with respect to a fixed observer, but appears always oriented in a different way as if the rod rotated around its own axis, giving rise to a phenomenon of "apparent rotation".

Thus, following this complexity, the known detection methods provide, for the rods with improved adhesion, to proceed with a measurement that could be defined as "indirect" of the dimensional characteristics of the piece in production, based on the measurement of the weight of a portion of rod of known length, purposely taken from the final product, following which it is possible to calculate a parameter called "nominal diameter" equal to the diameter of an equal-weighted smooth and perfectly cylindrical bar. This concept of "nominal size" is also invoked by certain existing rules and represents the average diameter that would have a smooth and uniform bar of equal weight.

With regard to the effectiveness of such indirect measurement, it is necessary to consider that due to various phenomena, including the wear of the mechanical parts of the wire drawing, but also the variability of the characteristics of the raw material, the size of the final product may vary during the wire drawing process. Therefore, to ensure the compliance of entire production with the dimensional requirements, it would be necessary to carry out continuous measurements, enabling continual adjustments of the members of the drawing process. Obviously it is not possible to collect a portion of sample if not upon completion of a roll of material because the reel can not be interrupted. Thus, given the usual amount of the weight of the reels in which the final product is wrapped and the diameters usually treated, the adjustment can be made only after several kilometers of wire already produced. This obviously entails a high risk of waste of entire roll, in case even one part of the product does not meet the requirements of the needed dimensional tolerance.

In any case, the interruption of the production process for collecting even a single sample at the end of the reel, is already a problem, because it reduces the productivity of the process. Moreover, adjusting the wire drawing process is extremely complicated due to the lack of a numerical indicator of the process, indicating the magnitude of the effect of the adjustment actually performed on the rod. For all this it is necessary to proceed for subsequent attempts and subsequent sample collection.

In addition, under the mentioned circumstances, in order to reduce the risk of waste and the number of mentioned attempts, the operative members adjustment of the wire drawing process is performed usually rounded up at an early stage and as a result of wear, during the process, the magnitude of excess adjustment, originally scheduled, can only increase. The corresponding excess used material represents a loss, because according to the usual terms of the contract, the material provided in excess than the agreed minimum is not admitted by the purchaser of the finished product.

U.S. Pat. No. 4,394,193 shows a method and a device for the continuous and contactless monitoring of the structural state of a metal strip being processed, by applying a cyclically variable metal flux.

U.S. Pat. No. 3,747,085 and application no. US2009/0072822 illustrate further examples of detection by use of magnetic fluxes.

DISCLOSURE

The object of the present invention is to solve the above-mentioned problems, devising an apparatus for detecting at least a physical quantity of a ferromagnetic product, in particular, the nominal diameter of ferromagnetic products, an installation for the production of a said product as well as a detection method, which permit to carry out in line, continuously and effectively the detection of the mentioned physical quantity.

More particularly, an object of the present invention is to continuously monitor, in particular in a wire drawing plant of smooth or ribbed profiles, the dimensional parameters of the product during production stage.

Another object of the present invention is to provide an apparatus for detecting the aforesaid quantity, which is of simple constructional and functional design, provided with safe and reliable use, as well as a relatively low cost.

The aforementioned objects are achieved, according to the present invention, by the apparatus for detecting at least one physical quantity of a ferromagnetic product according to claim 1, by the installation according to claim 13, as well as by the detection method according to claim 17.

The apparatus according to the invention comprises an annular shaped core open at a respective discontinuity or air gap, a detection zone defined by the aforementioned air gap and at least one electrical winding wound around at least a portion of the aforementioned core, configured to generate in the core itself a magnetic field, then a magnetic flux, which, through the air gap, passes through the aforementioned detection zone, when it is electrically powered, preferably with a variable current, in particular alternated.

According to an aspect of the invention, the core preferably comprises a plurality of iron sheets mutually insulated and superimposed on one another, so as to reduce the incidence of parasitic currents and consequently the losses in the magnetic circuit thus defined. Each sheet has preferably an open annular shape and is superimposed on the others.

When a ferromagnetic product is interposed, stationary or in motion, in the area of detection of the device according to the invention, the impedance and the reluctance of the magnetic circuit vary depending on the mass of portion of the product immersed in its magnetic field.

The apparatus according to the invention comprises a processing unit configured to detect electrical data of the electric winding, indicative of the impedance or of the reluctance in the magnetic circuit, and to process the calculation of a physical quantity of the product portion inserted through the air gap. The apparatus then permits to obtain, through the calculation performed by the aforementioned processing unit, the measurement of a quantity preferably of a reference size, in particular of a reference parameter called "nominal diameter" of the product portion. The aforesaid parameter represents the theoretical diameter of a reference product, having a uniform cylindrical shape, smooth surface and mass equal to that detected for the portion of product really inserted in the detection zone of the apparatus.

Essentially, the apparatus detects electrical data indicating the impedance or the reluctance of the magnetic circuit defined thereby, to preferably detect the value of the mass of a portion of product and to obtain, as a quantity derived through appropriate calculations, the aforementioned nominal diameter.

In other words, the apparatus permits to determine the amount of material constituting the portion of product object of detection. By means of this quantitative value it is possible to determine average indicative values of the transversal dimensions of the same portion of product.

The apparatus according to the invention also permits to continuously monitor, with appropriate detection means without direct contact with the product being processed, the nominal diameter, so as to automatically adjust the production and/or processing of the product itself.

The apparatus according to the invention is therefore very advantageous for monitoring the production parameters of rods or, more generally, profiles with irregular and variable cross-section, for example reinforcing rods for reinforced concrete, as it allows to determine in a effective and continuous way a non-physical dimensional parameter, but conventional, the aforementioned nominal diameter, very useful for the adjustement of the process itself.

The complexity of the product structure, in particular the presence of ribs or other elements characterizing a metal rod with improved adherence, does not substantially affect the result obtained by detecting, and, in any case, can be rendered irrelevant by appropriate calibration of the processing unit when the physical quantity is mesured by means of the apparatus according to the invention.

According to a particular aspect of the invention, the apparatus also comprises special sensor means associated with the processing unit, configured to detect electrical data indicative of the impedance or of the reluctance in the magnetic circuit.

According to a prerogative of the invention, the same processing unit is configured to compare the measured value of the detected physical quantity, in particular of the mass of a portion of product with a desired value, to establish the corrective actions of adjustment of the mechanical members of the installation in which the equipment is used.

In the case of a wire drawing plant, for example, where it is envisaged to pass the product through one or more reduction boxes, in order to obtain a rod or wire of certain transversal dimensions, the processing unit may perform a comparison, in a certain instant, of the value of the mass of a portion of rod being processed, with a desired value, equal to the mass of the smooth equal-weighted rod, so as to determine the need and, if necessary, the amount of adjustment of the wire drawing members, acting on the adjustment of one or more reduction boxes present in the production cycle.

In addition, the processing unit can signal by means of respective signaling means, for example by means of a specific interface or screen device, the opportunity and the extent of the reduction ratio to be achieved through the wire drawing members, or in the event that said members, in particular the reduction boxes, are controlled by specific actuator members, directly provide for adapting said ratio completely automatically and without any intervention by the operator.

In a completely similar manner, the apparatus permits to determine, for example, the medium side of a quadrangular section product, or other characteristic quantity which distinguishes a product of different structure, be it the side, the diagonal or the diameter.

The aforementioned detection zone of the apparatus according to the invention is defined between a pair of facing detecting surfaces of the core, between which the aforementioned air gap is so defined.

The detection zone can be shaped to improve the detection performance of the equipment. Preferably, the detecting surfaces are shaped, at least partially, in a manner conjugated to the cross section structure of the product being processed.

According to a particular aspect of the invention, the processing unit of the apparatus is configured to receive, by means of the aforesaid sensor means, electrical quantities of the circuit comprising the winding and any other circuit elements such as resistors, capacitors, etc. in order to amplify, readjust, center the detected signal.

In particular, these circuit elements can be configured to enable the detection of voltages and/or currents in the aforementioned electrical winding and to transmit one or more measurements to the processing unit.

The processing unit is preferably responsible for the evaluation of the acquired electrical measurements, so as to obtain a variation of the monitored quantities, for example through the calculation of the phase variation between an input signal and an output signal.

The processing unit can obtain, from the measurement of said electrical quantities, the instantaneous measurement of a physical quantity relative to the portion of product being processed in the defined detection zone.

For example, a decrease in reluctance is indicative of an increase in mass then of the nominal diameter of the product being processed, and vice versa.

Essentially, the apparatus according to the invention is configured to measure and compare, at certain time intervals or continuously, the weighing capacity determined by a solid product which passes through the aforementioned detection zone.

According to a particular aspect of the invention, the above mentioned variation of impedance or reluctance can be measured by feeding the aforementioned winding with a variable voltage, preferably sinusoidal, and detecting the phase variation of the output voltage or current of the winding itself or of a further winding, also wound around a portion of the core, envisaged for detection.

According to a particular aspect of the invention, the apparatus may further comprise a further electrical winding, wound around the core, in addition to a first electrical winding. In this case it is advantageous to provide for feeding the first electric winding with variable voltage or current so as to determine a magnetic induction field in the core and to detect on the second electrical winding the above mentioned signals, preferably an output signal, for the calculation of one or more quantities specific of the product being processed.

According to a particular aspect of the invention, it is possible to make a correlation between the aforementioned phase variation and a dimensional variation of the product being processed, preferably to a variation in the average diameter of a ferromagnetic rod.

Finally, according to a particular aspect of the invention, it is possible to provide that the circuit comprising the further winding intended for detection includes at least one resistance element and/or a capacitive element, to optimize the electrical voltage and/or current signals to be detected, thus increasing the accuracy of the detection.

DESCRIPTION OF DRAWINGS

The details of the invention will become more evident from the detailed description of a preferred embodiment of the apparatus for detecting at least one physical quantity of a ferromagnetic product, as well as an installation for the production of said product, illustrated by way of example in the accompanying drawings, in which:

FIG. 9 shows an installation for the production of ferromagnetic products in which the apparatus according to the invention is used;

FIG. 10 shows a detail of the installation shown in FIG. 9;

BEST MODE

With particular reference to FIGS. from 1 to 11, it has been indicated as a whole with 1 the apparatus for detecting the mass of ferromagnetic products, according to the invention.

The apparatus 1 comprises an annular shaped core 2, for example with a circular, elliptical or polygonal section, open at a respective discontinuity or air gap, a detection zone 3 defined by the aforementioned air gap and at least one electrical winding 4 comprising at least one turn, preferably a plurality of turns wound around at least a portion of the aforesaid core 2, configured to generate in the core 2 itself and through the aforementioned detection zone 3, a magnetic field M when the aforementioned electrical winding 4 is electrically powered.

Figure 1:
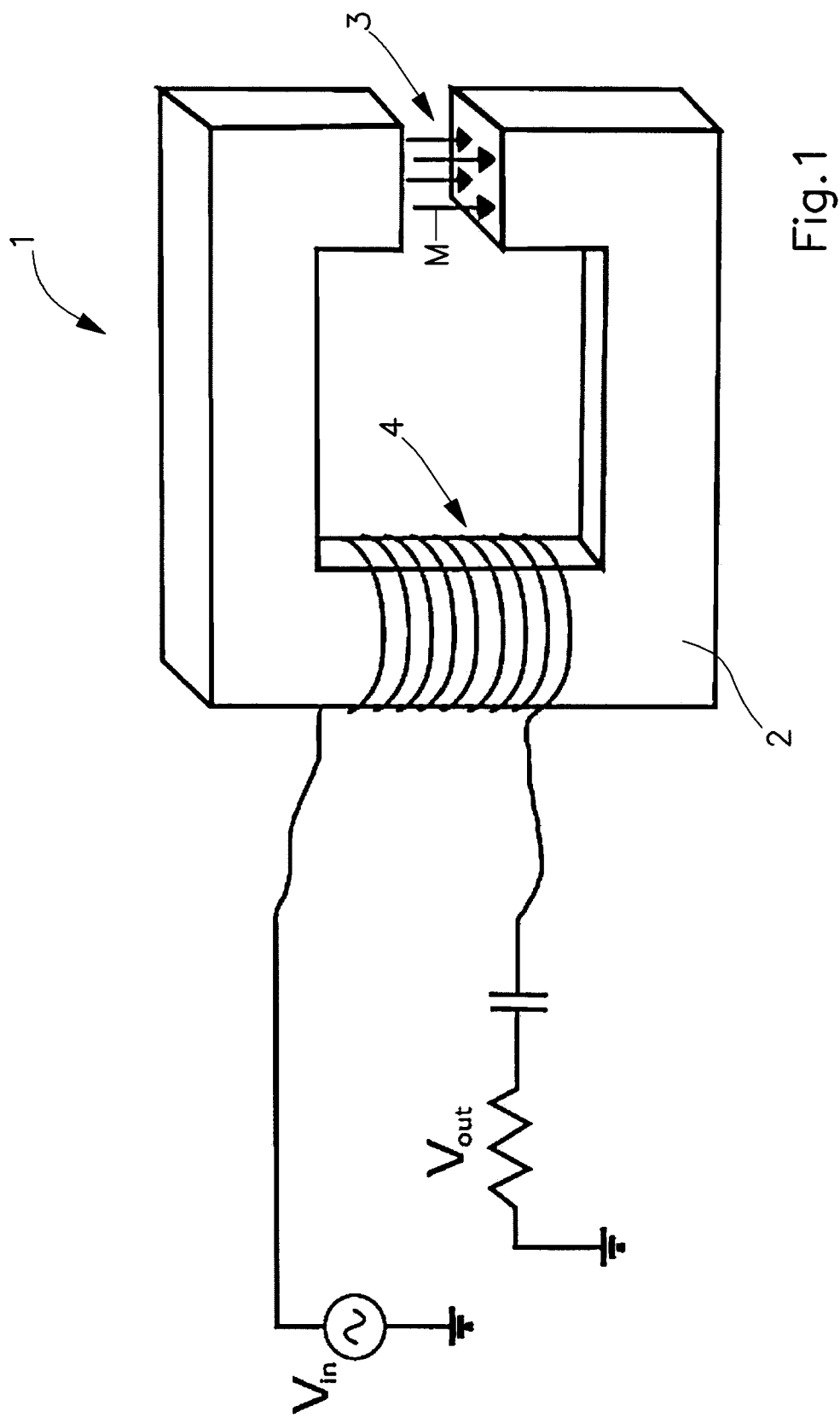
FIG. 1 shows a schematic perspective view of the apparatus according to the invention.

More precisely, the core 2 has an open annular development, preferably C shaped and, more precisely, comprising thus an interruption zone of the annular development called "air gap", at which the aforementioned detection zone 3 is defined (see, in particular, FIG. 1).

The core 2 is made of iron or similar material, preferably by means of a plurality of superimposed and insulated sheets, preferably treated and produced for the specific purpose.

Therefore the aforementioned sheets that form the core 2 are preferably C-shaped and superimposed on each other.

In the embodiment shown schematically in FIG. 1, the core 2 is C-shaped and comprises a first side, around which the aforementioned electrical winding 4 is wound. Preferably, to the first side is opposed one side at which annular or toroidal development of core 2 includes said air gap, at which is defined the above mentioned detection zone 3.

The detection zone 3 may have a cross-section of any shape, preferably at least partially coupled to the structure of the section of a product 5 to be detected.

Figure 5:
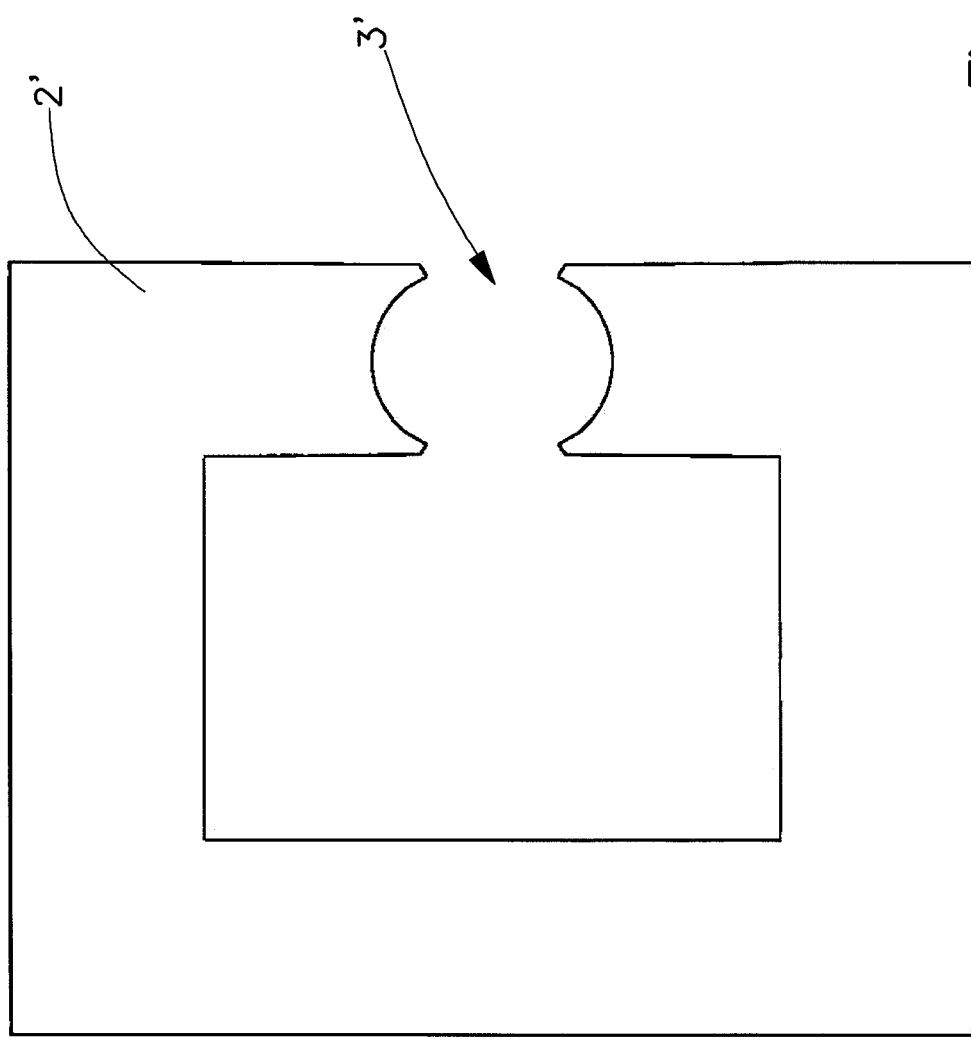
FIGS. 5 to 7 show respective embodiments of a component of the apparatus according to the invention.

The detection zone 3 is formed by a pair of facing surfaces of the core 2. Such surfaces may be flat, substantially parallel, or curved, for example semi-cylindrical, so as to follow the profile of the section of product 5 to be detected, which in the case of a metal rod corresponds to a substantially circular section, so as to make a detection zone 3' with a cylindrical conformation, suitable for surrounding, with an appropriate margin, the same rod (see the shape of the core 2' in FIG. 5).

Figure 6:
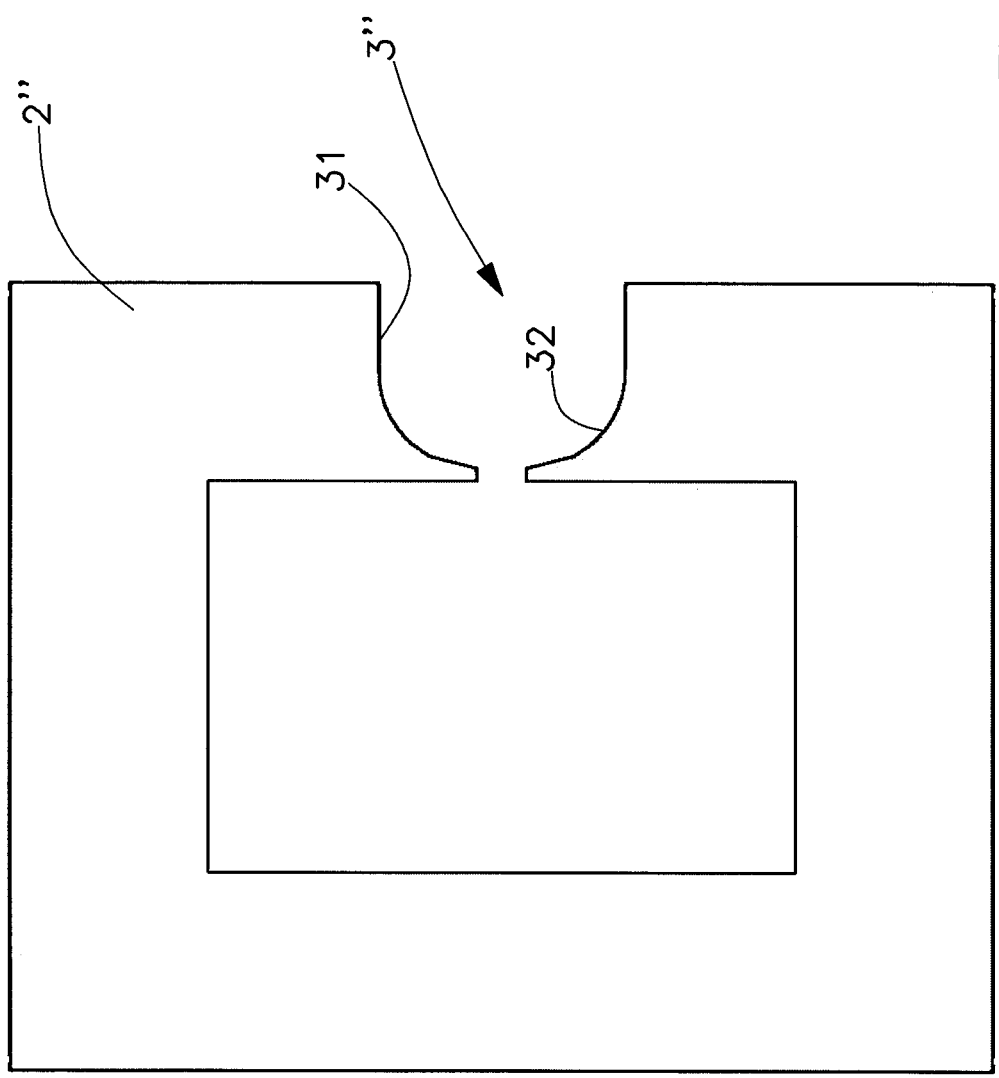

Alternatively, the detection zone 3" can form an inlet portion 31, preferably defined by a pair of flat surfaces arranged facing parallel or diverging, so as to ease a possible lateral entry of the product 5, and an opposed portion 32 to the aforementioned inlet portion 31, defined by convergent surfaces, preferably curved, for example partially cylindrical, so as to circumscribe the product 5 to be detected (see the core 2" in FIG. 6). The inlet portion 31, in particular, faces externally the annular profile of the core 2", so as to facilitate the lateral entry of the product 5 to be detected.

Figure 7:
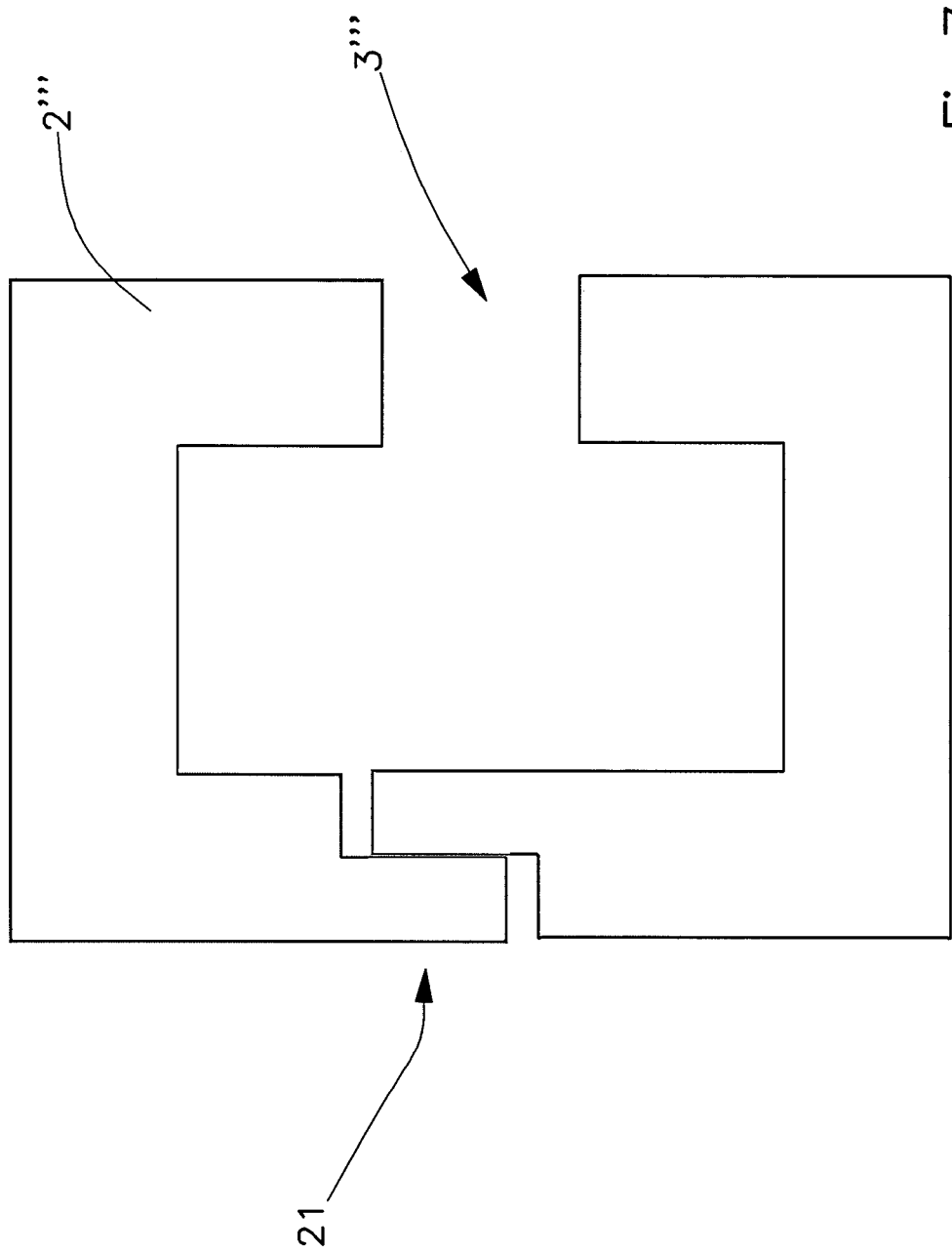

Alternatively still, it is possible to provide that the detection zone 3''' is of adjustable width (see the core 2''' of FIG. 7). In this case, the core 2''' may comprise an adjustment device 21 arranged on one side, in this case opposed to the detection zone 3''', to vary the width according to the product 5 to be detected.

The adjustment device 21 can be made, for example, by means of a pair of portions of the core 2''' arranged sliding or rotatable relative to one another to increase or reduce the width of the detection zone 3''', depending on the size of product 5 to be detected.

In fact, it is advantageous to adapt the aforesaid detection zone to the dimensions of the product 5, to ensure a high detection precision.

Therefore, the adjustment device 21 can permit an optimal sensitivity of the apparatus 1 in a wider size range of products 5.

Figure 3:
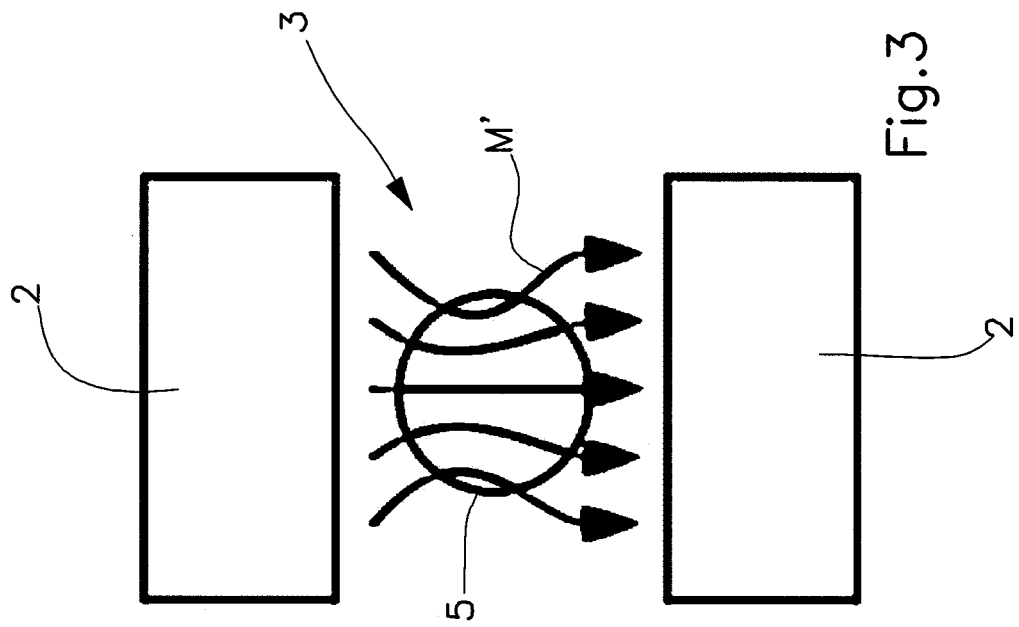
FIGS. 2 and 3 show a schematic front view of the detection zone of the apparatus according to the invention, in different operating conditions.
Figure 2:
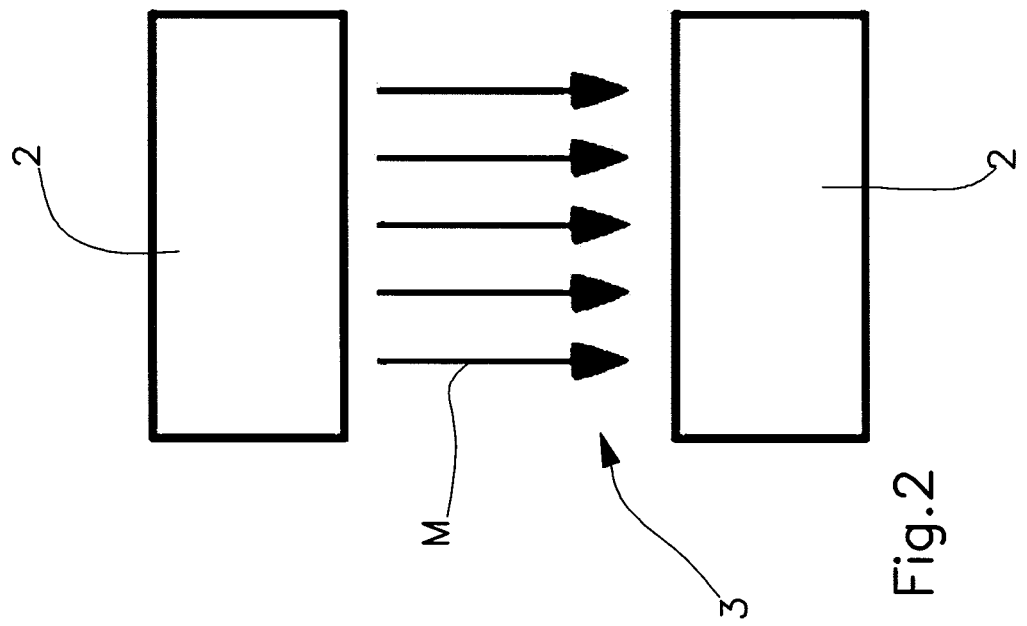

When the winding 4 is electrically powered, a magnetic field M is generated inside the core 2, according to any of the possible embodiments, whose specific magnetic quantities are perturbed, assuming a trend of the perturbed field lines M', at the detection zone 3, following the presence of a product 5 to be detected, for example of a ferromagnetic rod (see FIGS. 2 and 3).

It is then possible to detect, at a given instant, the mass, thus, in the final analysis, the size of the nominal or average diameter of the portion of product 5 interposed in the detection zone 3, or a different physical characteristic, based, for example on the impedance variation of the circuit detected through voltage and/or current measurements carried out in several points of the circuit.

The apparatus 1 comprises a processing unit 6 configured to detect this variation. Furthermore, suitable sensor means can be associated with the processing unit 6 for this purpose.

The aforesaid sensor means may comprise, for example, acquisition cards configured for the specific purpose, or electronic devices capable of measuring a voltage or current in an analogical manner, of sampling the measured values and then converting the same values into digital signals, to be processed with the use of ADC digital analog converters preferably customized or, in addition, known devices capable of directly providing an impedance measurement.

In the same way, analog or digital hardware devices can be used for generating and processing the excitation signal of the winding 4.

The processing unit 6 is configured, in particular, to make a correlation between the aforementioned variation of the measured electrical quantity and the mass of the product 5 to be detected, then, ultimately, to derive by means of the calculation a dimensional parameter useful for monitoring of the manufacturing or production process, such as the average or nominal diameter of the product.

Figure 4:
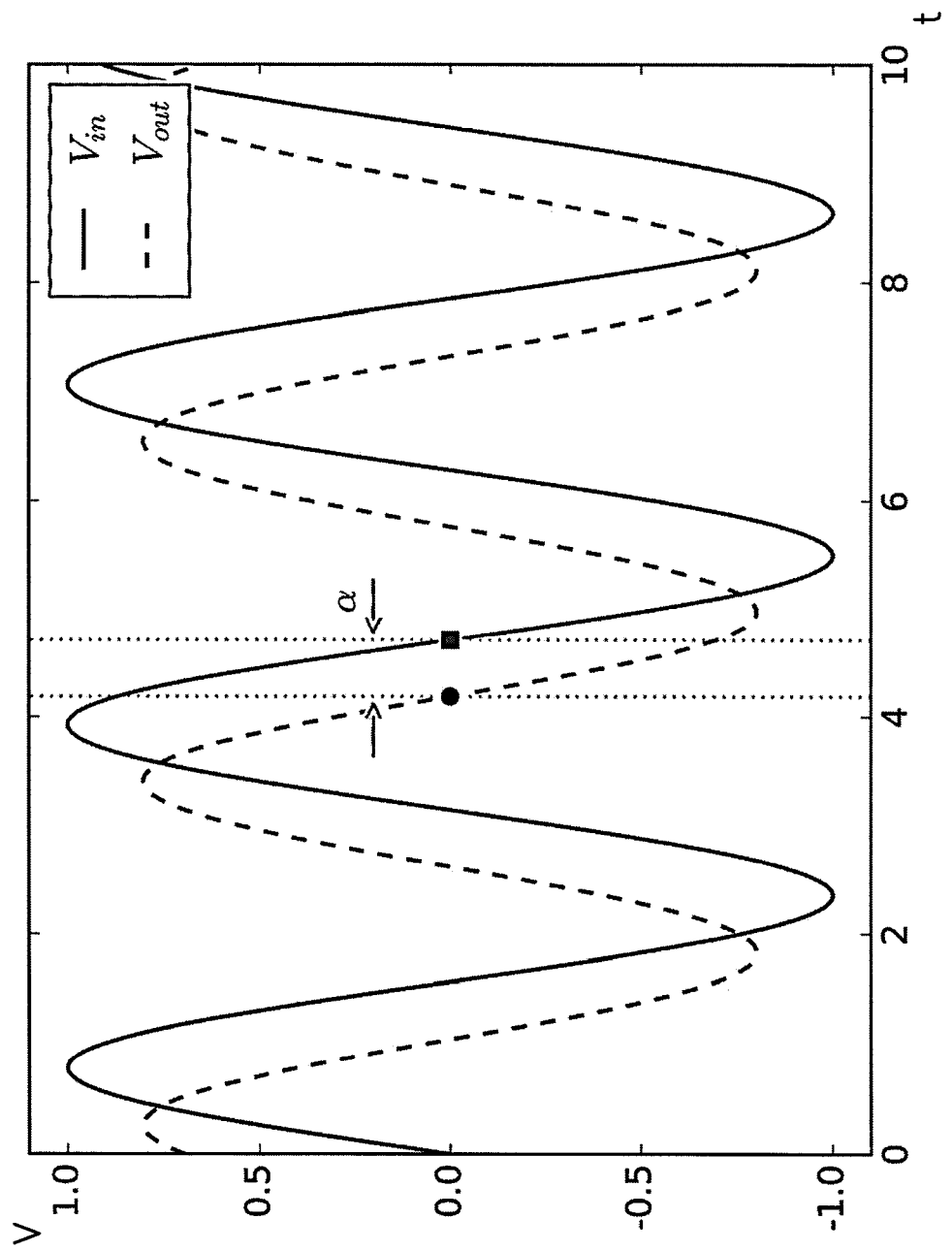
FIG. 4 shows a diagram of operation of the same apparatus illustrated in FIGS. 1 to 3.

More precisely, the aforesaid processing unit 6 can receive abovementioned signals indicating a variation in impedance from the sensor means. This is possible by feeding the electric winding 4 with an input voltage $V_{in}$, preferably sinusoidal, and detecting for example the phase variation a with respect to the output voltage $V_{out}$ (see FIG. 4). The same processing unit 6 can then correlate in real time the detected phase variation a to a measurement of the mass of the portion of product 5 in the detection zone 3, at a given instant. In other words, the measured quantity may be the mass of the portion of product 5 which instantaneously crosses the detection zone 3. From the measurement of the related quantity it is then possible to calculate, for example, the average diameter of the same portion of product 5.

Alternatively, it is possible to process the same quantity by signaling to the processing unit 6 the measurement of any other combination of electrical quantities of the circuit that permit to go back to the evaluation of the impedance.

Figure 11:
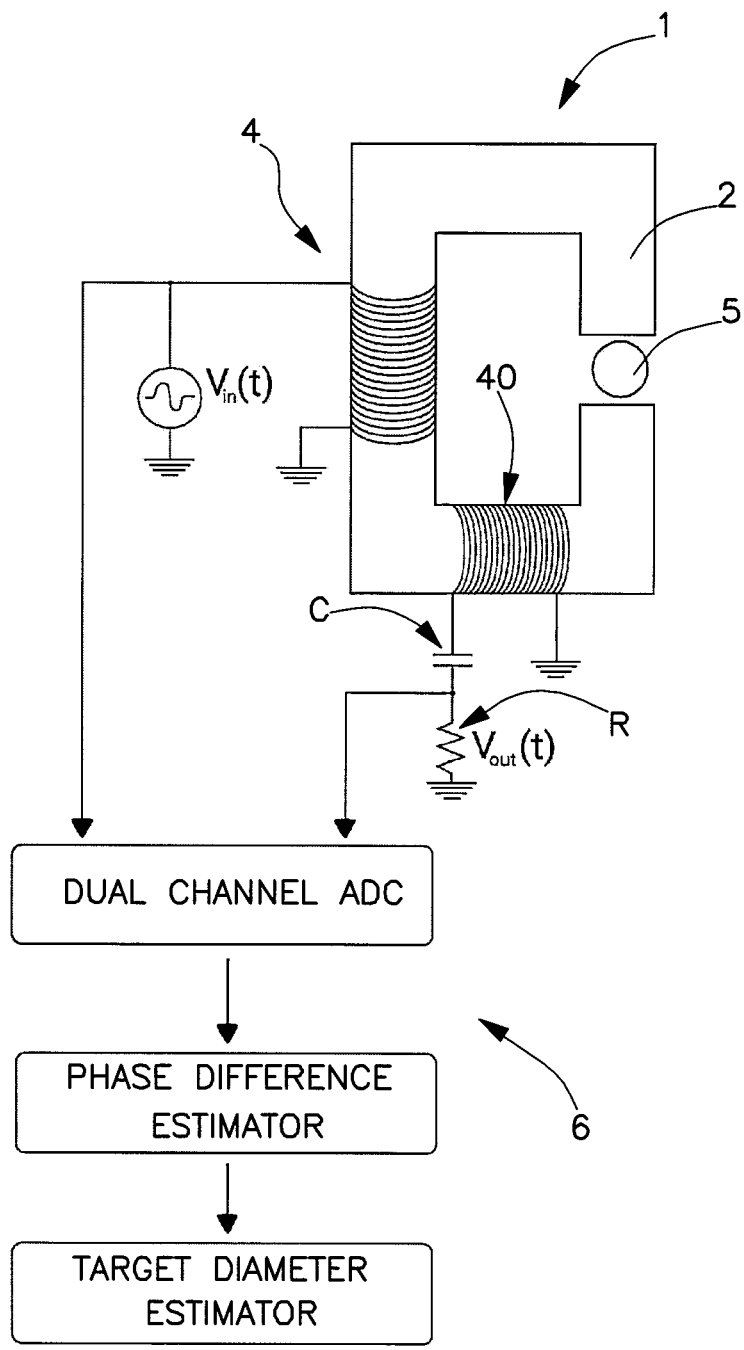
FIG. 11 shows a further embodiment of the apparatus according to the invention.

Alternatively, it is also possible to provide a further winding 40 wound around a respective side of the core 2 of the apparatus 1 (see FIG. 11). The first winding 4 can then be electrically powered to generate a magnetic induction field in the core 2, while the second winding 40 can act as a detecting winding, being connected to the processing unit 6, to perform the detection of the electric signals, as described above.

The windings, in particular the detecting winding 40, can further comprise components such as electrical resistance elements R or capacitor elements C configured to increase the accuracy of the measurement or to amplify the respective electrical signals.

The apparatus 1 can advantageously be used in an installation 10 for wire drawing ferromagnetic products 5, for example metal rods (see FIGS. 9 and 10).

The raw material passes through the implant 10 from an inlet section 11 to an outlet section 12, according to a feed direction A, in order to be subjected to successive wire drawing and feed stages by corresponding processing assemblies.

More specifically, the installation 10 may comprise, in succession, a rectifying and/or drifting assembly 13, a saponification assembly 14, one or more reduction assemblies or boxes 15, as well as a drawing unit 16 arranged upstream of the outlet section 12.

In particular, each reduction assembly 15 may comprise two or more reduction wheels 17, for example distributed radially in set of three or four around the feed direction A so as to define a passage for the product 5 along the same feed direction A. The reduction action impressed by the reduction wheels 17, thus the amplitude of the passage defined between them, can be adjusted, for example manually by means of a suitable adjustment handle 18 (see FIG. 10).

The installation 10 furthermore comprises one or more apparatus 1 for instantaneously detecting the mass of successive portions of the product 5 moving through the detection zone 3 of each provided apparatus 1.

Each apparatus 1 present in the installation 10 can be advantageously arranged downstream of one or more reduction assemblies 15, to monitor, as previously described, the mass of the product 5 being processed. An apparatus 1 is provided downstream of each reduction assembly 15 in the installation 10 shown in FIGS. 9 and 10. Preferably, the apparatuses 1 can be used in the installation 10 to monitor mass variations for each portion of product 5 which passes through a respective detection zone 3 of the apparatus 1, and therefore of diameter or transversal dimensions to be detected, of the product 5 being processed.

It is further possible to provide a further apparatus 1 arranged upstream of the first reduction box 15 in order to detect the transversal sizes of the product 5, so as to be able to make the necessary adjustments taking into account the variations of the transversal dimensions of the raw material supplied to the installation 10.

According to an alternative embodiment, it is advantageous to use an apparatus 1 upstream of the last provided reduction box 15, according to the feed direction A, and a further apparatus 1 downstream of the same box. In this way it is possible to effectively monitor any variations of at least one physical quantity, for example a transverse dimension, of the product 5.

In essence, the apparatus 1 permits to obtain and monitor, in a continuous manner, instantaneous measurements, similar to the weighing capacity of material constituting the product 5 being processed, which passes through the detection zone 3 in a determined processing step, for example downstream of the first reduction assembly 15 or of the second, if provided, upstream and downstream of at least one stage.

A sequence of measurements or sampling, for example at certain time intervals or substantially continuously, can be memorized and continuously updated by the processing unit 6, so as to monitor any significant variations, with respect to a predefined tolerance, of the single measured values or of an average calculated on a determined number of measures. The detection of a said variation can then enable an adequate adjustment of at least one operating assembly or, preferably, of the operative members present in the installation 10.

The operation of the apparatus for detecting the mass of ferromagnetic products according to the invention is easily understandable from the above description.

For example, the apparatus 1 is arranged in the installation 10 for wire drawing metal rods, downstream of each reduction assembly 15.

The apparatus 1 is also advantageously provided in the installation 10 for wire drawing metal rods upstream of the last provided reduction assembly 15.

The raw material constituting the product 5 being processed is inserted in the inlet section 11 of the installation 10, placed in progress along the feed direction A and subjected, as it is known, to treatment, pulling and reduction actions up to the outlet section 12.

Figure 8:
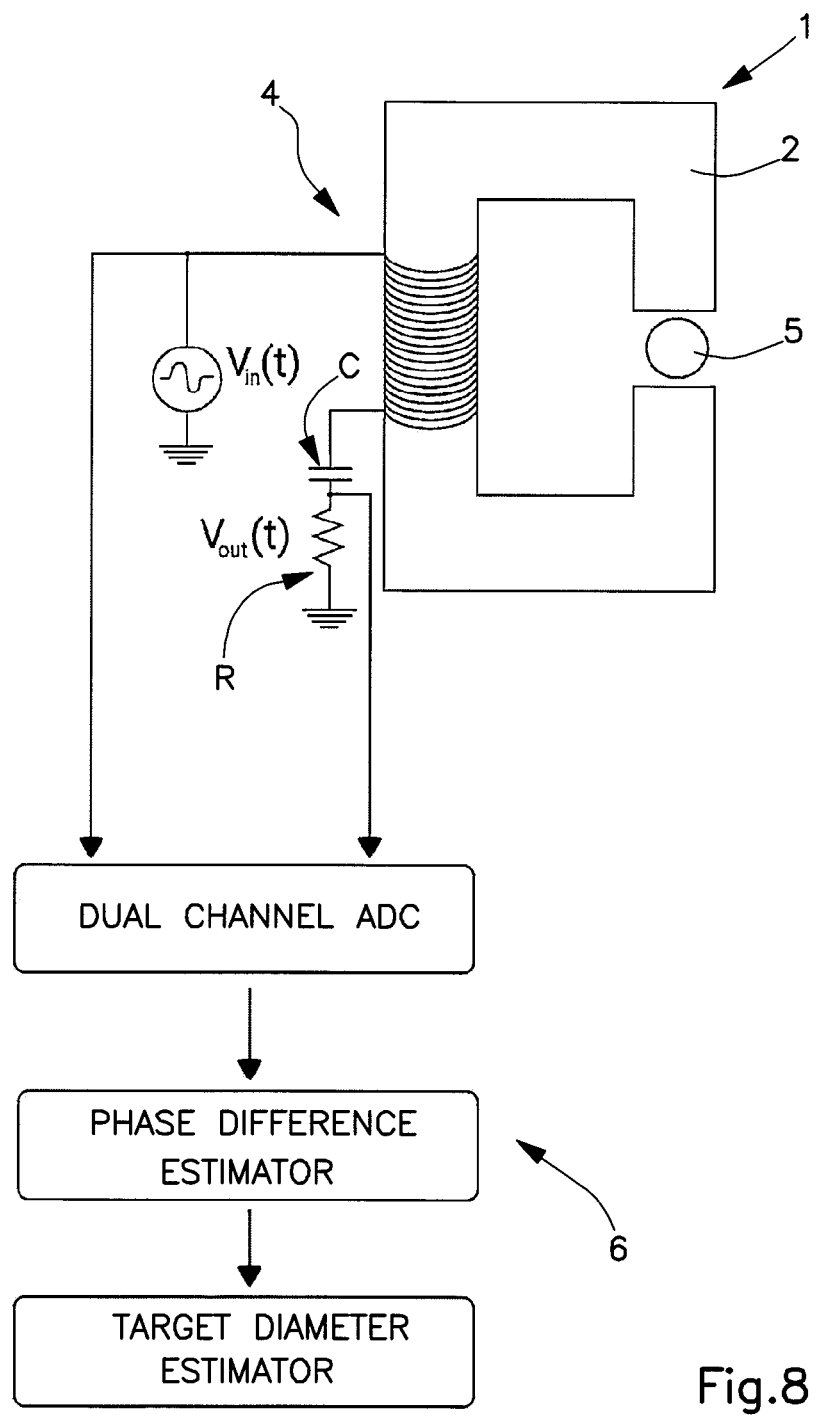
FIG. 8 schematically shows a block diagram representative of the operation of the same apparatus.

The electrical winding 4 of each apparatus 1 provided with a known input voltage $V_{in}$ is then powered and an output voltage $V_{out}$ is detected (see FIG. 8).

To monitor the results of the production process, the apparatus 1 continuously detects the input voltage $V_{in}$ and the output voltage $V_{out}$.

The measurement performed by the apparatus 1 can advantageously be made continuously, so as to detect variations in the dimensional and/or physical characteristics of the product 5 being processed. The aforementioned measurement, alternatively, can be performed by sampling at predetermined time intervals. An average of a certain number of values or of an increasing number of values can be calculated and/or updated continuously, in order to monitor the aforesaid characteristics.

For example, the processing unit 6 detects samples of electrical quantities used to evaluate a variation of the phase a of the electric signals, voltage or current, relating to the winding 4 (see FIG. 8) through a dual channel ADC, correlating it then to the mass of the section of rod in crossing and, in the last analysis, to a variation of the average diameter of the product 5, so as to enable a continuous adjustment of the operating members of the installation for wire drawing metal rods, or for example in manual mode, through the adjustment handle 18, or automatically, by means of suitable actuators and respective command members.

The apparatus 1 thus enables an accurate and continuous adjustment of the processing of ferromagnetic products, particularly during the wire drawing process.

The apparatus 1 according to the invention permits, in particular, in the last analysis, to precisely detect the average diameter of the product 5 being processed, or a different reference dimensional parameter, and to adjust accordingly the production parameters during execution of the production process. This object is achieved thanks to the capability of the apparatus 1 to detect impedance variations through the electric circuit determined by feeding the winding 4. The magnetic field M thus generated inside the core 2 is in fact sensitive to the passage of a ferromagnetic body through the detection zone 3 formed in the core 2 itself.

Particularly in wire drawing installations 10, where the reduction of the diameter of the product 5 being processed takes place in one or more stages, an apparatus 1 may be provided upstream and one downstream of a reduction assembly 15. In this way it is possible to obtain real-time information on the need to adjust the reduction members and provide, according to a pre-established logic, intervening only on the reduction assembly, the last of the line, or, in a distributed manner, on the different components of successive reduction in the installation.

If apparatuses 1 are provided for each reduction assembly 15, it is possible to carry out targeted corrective actions, for each section of the installation 10, in order to obtain the product 5 of the desired dimensions and, at the same time, distribute the forces acting on the mechanical components of the installation 10.

It is also advantageous, as mentioned previously, to provide an apparatus 1 according to the invention also at the inlet section 11 of the installation 10, so as to monitor the size of the inserted product 5 and calculate the actual dynamic load of the first reduction assembly 15.

The apparatus 1 according to the invention can advantageously be used also in a variety of metal wire working installations, such as for example winding machines, straightening machines, stirrup machines, shapers, cage making machines, assembling machines. In fact, the apparatus 1 according to the invention permits, also in these types of installations, to automatically and contactlessly detect some parameters of the raw material being processed, for example the average diameter, which can be used both to process settings of the installation itself, and to control the processes of other production cycles carried out upstream and downstream of the installation.

Finally, the apparatus 1 can also be used only to detect the simple presence of the product 5 in the detection zone 3.

The apparatus described as an example is susceptible of numerous modifications and variations depending on the different needs.

In the practical embodiment of the invention, the used materials, as well as the shape and the dimensions, may be any according to requirements.

Should the technical features mentioned in any claim be followed by reference signs, such reference signs were included strictly with the aim of enhancing the understanding of the claims and hence they shall not be deemed restrictive in any manner whatsoever on the scope of each element identified for exemplifying purposes by such reference signs.

The invention claimed is:

1. An apparatus for detecting at least one physical quantity of a ferromagnetic product, the apparatus comprising:
    an iron core having an annular shape open at a respective discontinuity or air gap, a detection zone being defined by the air gap;
    at least one electrical winding comprising at least one turn or a plurality of turns wound around at least a portion of said core, configured to generate in said core a magnetic field and, through said air gap, a magnetic flux passing through said detection zone, when said electrical winding is electrically powered, said magnetic field being perturbed by the presence of a portion of a said ferromagnetic product stationary or moving in said detection zone;
    a processing unit configured to detect a variation of at least one electrical quantity relative to said electrical winding and to correlate said variation to said physical quantity relative to said portion of said product stationary or moving in said detection zone,
    wherein said processing unit is configured to determine a mass of said portion of said product stationary or moving in said detection zone and, on the basis of said determined mass, to calculate at least one transverse dimension of said portion of product, corresponding to a diameter of a portion of the same extension of a reference or nominal product, having a uniform circular cross-section, a smooth surface, and a mass equal to said determined mass,
    said processing unit being further configured to detect a phase variation of an output voltage or of an output current of said electrical winding and correlating said phase to said physical quantity of said portion of said product determining in this way the mass of said portion of said product.

2. An apparatus according to claim 1, wherein said processing unit is configured to calculate, continuously or at predetermined time intervals, said physical quantity relative to said portion of said product when said product crosses in motion said detection zone.

3. An apparatus according to claim 1, wherein said electrical winding is powered by an electric current which varies over.

4. An apparatus according to claim 3, wherein said electrical winding is powered by alternating electric current.

5. An apparatus according to claim 4, wherein said processing unit is configured to detect an input voltage or an input current and an output voltage or an output current, at two respective points of the electric circuit comprising said electrical winding, so as to determine said physical quantity relative to said portion of said product.

6. An apparatus according to claim 5, wherein said processing unit is configured to detect a phase variation for said output voltage or for said output current and to correlate said phase variation with said physical quantity, relative to said portion of said product stationary or moving in said detection zone.

7. An apparatus according to claim 1, wherein said core is C-shaped, said detection zone is defined between the respective interrupted portions of said C shape.

8. An apparatus according to claim 7, wherein said core is made up of a plurality of sheets shaped according to said "C" profile, superimposed and isolated from each other.

9. An apparatus according to claim 1, wherein said detection zone is shaped by a pair of facing surfaces of said core, shaped in a flat and substantially parallel manner.

10. An apparatus according to claim 1, wherein said detection zone shapes an inlet portion, defined by a pair of flat surfaces arranged facing parallel or diverging, so as to ease a lateral entry of said product, and a portion, opposite to said inlet portion, defined by converging surfaces, is curved, to circumscribe said product to be detected.

11. An apparatus according to claim 1, wherein said detection zone is shaped so as to have an adjustable width, said core comprising, on one side preferably opposed to said air gap, an adjustment device made up of a pair of portions of said core arranged sliding or rotating relative to one other.

12. An apparatus according to claim 1, further comprising:
a further winding wound around a respective side of said core, said winding being electrically powered to generate said magnetic flux in said core, and said further winding acting as a detection winding and being connected to said processing unit, to detect said physical quantity of said product segment.

13. An installation for processing at least one ferromagnetic product, the installation being predisposed to feed said product along a feed direction, the installation comprising:
at least one apparatus comprising:
an iron core having an annular shape open at a respective discontinuity or air gap,
a detection zone being defined by the air gap;
at least one electrical winding comprising at least one turn or a plurality of turns wound around at least a portion of said core, configured to generate in said core a magnetic field and, through said air gap, a magnetic flux passing through said detection zone, when said electrical winding is electrically powered, said magnetic field being perturbed by the presence of a portion of a said ferromagnetic product stationary or moving in said detection zone;
a processing unit configured to detect a variation of at least one electrical quantity relative to said electrical winding and to correlate said variation to a physical quantity
relative to said portion of said product stationary or moving in said detection zone, wherein said processing unit is configured to determine a mass of said portion of said product stationary or moving in said detection zone and, on the basis of said determined mass, to calculate at least one transverse dimension of said portion of product, corresponding to a diameter of a portion of the same extension of a reference or nominal product, having a uniform circular cross-section, a smooth surface, and a mass equal to said determined mass,
wherein the apparatus is arranged with said respective detection zone along said feed direction, to continuously monitor the at least one physical quantity, relative to said product and/or a dimensional quantity correlatable thereto,
said processing unit being further configured to detect a phase variation of an output voltage or of an output current of said electrical winding and correlating said phase to said physical quantity of said portion of said product determining in this way the mass of said portion of said product.

14. An installation for processing at least one ferromagnetic product according to claim 13,
further comprising an inlet portion and an outlet portion for said product, a drawing unit for feeding said product along said feed direction, arranged upstream of said outlet portion, and at least one processing unit, wherein said apparatus is arranged upstream of said processing unit and a further said apparatus is arranged downstream of said processing unit according to said feed direction.

15. An installation for processing at least one ferromagnetic product according to claim 14,
wherein a plurality of said processing units are provided, said apparatus being arranged upstream and said further apparatus being arranged downstream of the last of said processing units, according to said feed direction.

16. An installation for processing at least one ferromagnetic product according to claim 14,
wherein said apparatus is arranged immediately upstream of the last one of said working units according to said feed direction.

17. A method for detecting at least one physical quantity of ferromagnetic products being processed in an installation for processing said products, the method comprising the steps of:
providing an apparatus for detecting said physical quantity along a feed direction of a said product, said apparatus comprising
an iron core having an annular shape open at a respective discontinuity or air gap,
a detection zone being defined by the aforementioned air gap and arranged along said feed direction,
at least one electrical winding wound around at least a portion of said core, configured to generate in said core a magnetic field and, through said air gap,
a magnetic flux crossing said detection zone, when said winding is electrically powered, said magnetic field being perturbed by the presence of a portion of said ferromagnetic product stationary or moving in said detection zone, and a processing unit configured to detect a variation of at least one electrical quantity relative to said electrical winding and to correlate said variation to said physical quantity relative to said portion of said product stationary or moving in said detection zone;

feeding a said product being processed along said feed direction;

detecting through said working unit an input voltage or an input current and an output voltage or an output current for said electrical winding;

correlating a variation of the signal of said output voltage or of said output current with said physical quantity of said portion of said product, arranged stationary or in motion in said detection zone, determining in this way the mass of said portion of said product; and detecting a phase variation of said output voltage or of said output current and correlating said phase to said physical quantity of said portion of said product determining in this way the mass of said portion of said product.

18. A method for detecting according to claim 17, further comprising the step of calculating, through said processing unit, on the basis of said determined physical mass, relative to said product section, and to the longitudinal extension of said portion of product, a transverse dimension or a nominal diameter of said portion of said product, corresponding to the diameter of a portion having the same extension of a reference or nominal product, having a uniform circular cross-section, a smooth surface, and a mass equal to said determined mass.

19. A method for detecting according to claim 17, further comprising the steps of detecting said physical quantity continuously or at predetermined time intervals and to continuously adjust at least one processing parameter of at least one working unit of said product arranged in said installation along said feed direction, in a manner corresponding to said determined physical quantity or to an average of values detected for said physical quantity through said processing unit.

* * * * *